United States Patent

Sakaue

[19]

[11] Patent Number: 5,825,833
[45] Date of Patent: Oct. 20, 1998

[54] DIGITAL AND ANALOG RECEPTION APPARATUS

[75] Inventor: Yoichi Sakaue, Kanagawa, Japan

[73] Assignee: Mitsumi Electric Co., Ltd., Tokyo, Japan

[21] Appl. No.: 594,183

[22] Filed: Jan. 31, 1996

[30] Foreign Application Priority Data

Jan. 31, 1995 [JP] Japan ..................................... 7-034436

[51] Int. Cl.$^6$ ............................ H04L 27/00; H04L 27/06
[52] U.S. Cl. ......................... 375/344; 375/216; 375/316; 455/182.2
[58] Field of Search ..................................... 375/344, 216, 375/316, 324; 348/11, 725, 726, 735, 536; 455/260, 192.2, 264, 318, 183.1, 196.1, 259, 316, 182.2; 327/1

[56] References Cited

U.S. PATENT DOCUMENTS

| | | | |
|---|---|---|---|
| 4,320,530 | 3/1982 | Ikeda | 455/182 |
| 5,163,159 | 11/1992 | Rich et al. | 375/344 |
| 5,203,032 | 4/1993 | Usui | 455/182.2 |
| 5,355,532 | 10/1994 | Kubo et al. | 455/301 |
| 5,418,815 | 5/1995 | Ishikawa et al. | 375/344 |
| 5,493,714 | 2/1996 | Cahill | 375/216 |

FOREIGN PATENT DOCUMENTS 6-253226  9/1994  Japan .

*Primary Examiner*—Stephen Chin
*Assistant Examiner*—Betsy L. Deppe
*Attorney, Agent, or Firm*—Patents & TMS; Brian M. Mattson

[57] ABSTRACT

A digital and analog reception apparatus includes a first mixer (MIX1) which converts up a reception signal having an input frequency fa inputted into an input terminal IN and a second mixer (MIX2) which converts down a first intermediate frequency fc of a signal outputted from the first mixer (MIX1) by using a second local frequency fd and a second intermediate frequency fe. The apparatus is also provided with a phase-locked loop (PLL), an automatic frequency controller (AFC) which comprises a second local oscillator and a low frequency band pass filter unit LPF adjusts a second local frequency fd, and a microcomputer discriminates an analog/digital distinction of the reception signal having the input frequency fa. Upon receiving an analog signal, the digital and analog reception apparatus deactivates a low-pass filter unit LPF, thereby having an AFC signal control a second local oscillator. On the other hand, upon reception of a digital signal, the phase-locked loop (PLL) and the low-pass filter unit LPF control the second local oscillator.

8 Claims, 2 Drawing Sheets

DIGITAL AND ANALOG RECEPTION APPARATUS

BACKGROUND OF THE INVENTION

1. Field of the Invention

This invention relates to a digital and analog reception apparatus, and in particular to a digital and analog reception apparatus which is for example used for a double-ended conversion type CATV converter having an automatic frequency controller (AFC).

2. Description of the Related Art

Recently, studies have been actively conducted for transmitting a digital signal in addition to an analog signal as a method for multiplying the number of channels available for a cable television (CATV) broadcasting system. For this purpose, such a CATV broadcasting system includes a reception apparatus having a CATV converter for converting received analog and digital signals, in which an analog signal and a digital signal are processed in different ways.

FIG. 1 shows a CATV converter of a double-ended conversion type (up/down conversion type) of a conventional reception apparatus A used in the CATV broadcasting system. Specifically, FIG. 1 is a block diagram illustrating the circuit configuration of the CATV converter of the conventional reception apparatus A. In this reception apparatus A, an external wire cable (not shown) supplies to an input terminal IN a reception signal having an input frequency fa in a predetermined frequency range (e.g. between fifty megahertz [50 MHz] and five hundred fifty megahertz [550 MHz]).

In more details, the reception apparatus A is provided with a low-pass filter 1 which allows to pass through only a low frequency component of the reception signal having the input frequency fa received at the input terminal IN. An output from the low-pass filter 1 is inputted to an automatic gain controller (AGC) 2. The automatic gain controller 2 stabilizes signal level of the inputted signal at a constant regardless of the signal level of the inputted signal by automatically controlling a gain (a magnitude of amplification) of the inputted signal. Namely, in the automatic gain controller (AGC), when the signal level of the inputted signal is high a gain is lowered, while the signal level thereof is low a gain is raised. An output from the AGC is inputted to a tuning low-pass filter 3 which is formed in correspondence with the frequency range (i.e. between fifty megahertz [50 MHz] and five hundred fifty megahertz [550 MHz]) of the reception signal having the input frequency fa. The tuning low-pass filter 3 converts the frequency of the inputted signal from the automatic gain controller (AGC) 2 into either one in a high frequency band or one in a low frequency band. An output from the tuning low-pass filter 3 is inputted to an amplifier (AMP) 4 in which the inputted signal from the up/down converter 3 is amplified. An output from the amplifier 4 is then inputted to a first mixer (MIX1) 7. A first local oscillator 5 also supplies a first local oscillation signal having a first local frequency fb to the first mixer (MIX1) 7 through a first buffer amplifier 6 which amplifies the first local oscillation signal. In the first mixer (MIX1) 7, the first local frequency fb of the first local oscillation signal and the input frequency fa of the reception signal are mixed to obtained a first beat signal having a first intermediate frequency fc based on the frequency difference between these signals. An output from the first mixer (MIX1) 7, that is the first beat signal is then inputted into a first intermediate frequency band pass filter 8 which allows to pass through only a medium frequency component within a predetermined frequency band of the first beat signal. An output from the first intermediate frequency band pass filter 8 is inputted to an intermediate frequency amplifier 9, in which the first beat signal having the first intermediate frequency fc filtered by the first intermediate frequency band pass filter 8 is amplified to be within a predetermined frequency band. An output from the intermediate frequency amplifier 9 is fed to a second mixer (MIX2) 12. Further; a second local oscillator 10a also supplies a second local oscillation signal having a second local frequency fd to the second mixer (MIX2) 12 through a second buffer amplifier 11 which amplifies the second local oscillation signal. In the second mixer (MIX2) 12, the second local frequency fd of the second local oscillation signal and the first intermediate frequency fc of the first beat signal are mixed to obtain a second beat signal having a second intermediate frequency fe based on the frequency difference between these signals. An output from the second mixer (MIX2) 12 is then inputted to a second intermediate frequency band pass filter 13 which allows to pass through only a medium frequency component within a predetermined frequency band of the second beat signal. An output from the second intermediate frequency band pass filter 13 is then outputted from an output terminal OUT, which forms an output of the reception apparatus A.

Although this is not specifically shown in the drawing, the output terminal OUT has its latter stages connected sequentially to an intermediate frequency amplifier, a wave-detection demodulator for extracting a voice signal from the second intermediate frequency fe, a voice low-pass filter, a line securitizer (comprising a coder and a decoder), a voice amplifier, a decompressor for decompressing a waveform having an amplitude compressed for a transmission, and an output amplifier.

A voice signal is extracted from a carrier wave centered at the input frequency fa and received via wire cable through these circuit elements mentioned above. In this regard, it should be noted that in FIG. 1 Ca represents a control signal inputted to the automatic gain controller (AGC) 2, and Vt represents a supply voltage applied to the tuning low-pass filter 3.

In the reception apparatus having the above structure, when the first mixer (MIX1) 7 receives an input of a high frequency signal (a radio frequency [RF] signal) mixed by superposing two frequencies, i.e. when the first mixer (MIX1) 7 receives as its input the reception signal having the input frequency fa externally supplied via the input terminal IN mixed with the first local oscillation signal having the first local frequency fb generated by the first local oscillator 5, the first mixer (MIX1) tunes the reception signal with a tuner (parallel resonant circuit) comprising a tuning transformer (i.e. an intermediate frequency transformer) and a capacitor, thereby obtaining the first intermediate frequency fc from the frequency difference between the input frequency fa and the first local frequency fb, which is then sent to the first intermediate frequency band pass filter 8 connected at the succeeding stage.

A selectivity Q of the tuner determines the aptitude of its characteristics. Because a higher value of the selectivity Q enables more of a signal to be amplified and more of a noise to be attenuated, it is generally necessary to design the selectivity Q to have a high value. At this time, the tuner is set such that the selectivity Q matches its impedance with that of the circuit elements connected at its latter stages including the intermediate frequency band pass filter 8.

When an analog signal is to be processed using the CATV converter of a double-ended conversion type (up/down conversion type) as described above, the first local oscillator 5 is usually constructed from a phase-locked loop (PLL) for tracking a frequency. The phase-locked loop (PLL) is generally composed of a phase detector (PD), a low-pass filter (LPF) and a voltage control oscillator (VCO). Further, the second local oscillator 10a is usually constructed from a circuit including a SAW resonator or an inductor or the like.

On the other hand, there is known another type of digital CATV converter which uses e.g. a VSB-AM method, in which voice and other sounds are transferred per an AM (amplitude modulation) method whereby the amplitude of a carrier wave is modulated in accordance with the amplitude of a signal wave by using a medium frequency electric wave having a frequency range between six hundred forty kilohertz [640 KHz] and two thousand five hundred sixty kilohertz [2560 KHz]. Such a digital CATV converter features a good match with a reception apparatus, since its signal format is compatible with that of a coaxial cable system, although factors such as a non-linear distortion and a reception side S/N ratio limit the multiplexity and transmission distance. When such a digital CATV converter is applied to the circuit configuration as shown in FIG. 1, both the first local oscillator 5 and the second local oscillator 10a have a phase-locked loop (PLL), and a channel selection is made in the phase-locked loop circuits so as to dwarf a PLL frequency step on a secondary side, thereby making an adjustment control of an input signal deviation through a detection of a signal from a digital demodulator.

However, if such a CATV converter of the conventional reception apparatuses is designed so as to be able to receive both a digital signal and an analog signal, it must have individual demodulators for respective signals as well as additional circuits for processing respective signals as described above. Such a structure gives raise to disadvantages such as a higher manufacturing cost, a larger size and a heavier weight, because of a complex circuit configuration required for such separate demodulators.

SUMMARY OF THE INVENTION

This invention has been made for solving the above problems. Accordingly, an object of the present invention is to provide an digital and analog reception apparatus for commonly receiving both a digital signal and an analog signal, with a simple low-cost circuit configuration, as a system capable of automatically adjusting a frequency deviation caused by an ambient environment and a frequency deviation caused by an analog transmission system having a poor frequency accuracy.

In order to achieve the above-mentioned object, the present invention is directed to an digital and analog reception apparatus having a converter for converting the frequency of a reception signal, being either of an analog signal and a digital signal, and an output terminal for supplying an output from the converter. The converter comprises an automatic frequency controller (AFC) for stabilizing the frequency of a signal outputted from the converter. The automatic frequency controller (AFC) comprises a local oscillator capable of varying its oscillating frequency and a common input terminal (Vs) for receiving both a signal for controlling the local oscillator when the reception signal is an analog signal and a signal for controlling the local oscillator when the reception signal is a digital signal.

According to the digital and analog reception apparatus, since it enables to receive both an analog signal and a digital signal and it uses most of its components for commonly receiving both signals, it has a simple circuit configuration with a reduced number of components. Therefore, the reception apparatus has an advantage of a small size and a low manufacturing cost.

Further, this reception apparatus has a further advantage of being able to obtain an output signal having a stable frequency, upon receiving both an analog signal and a digital signal. Especially, it can appropriately adjust a frequency deviation caused by an ambient environment and a frequency deviation caused by an analog transmission system having a poor frequency accuracy.

In this reception apparatus, it is preferred to further include control means for controlling the selection of a signal inputted into the common input terminal (Vs) in accordance with an analog/digital distinction of the reception signal. In this case, the control means may have discrimination means for discriminating the analog/digital distinction of the reception signal and a memory for storing data on the analog/digital distinction of the reception signal, in which the discrimination means discriminates the analog/digital distinction of the reception signal, based on data stored in the memory.

If the reception apparatus has such a controller, namely such a discriminator for discriminating the analog/digital distinction of a reception signal, it can automatically perform a control and an adjustment in a frequency deviation in accordance with a reception signal.

Another aspect of the present invention is directed to an digital and analog reception apparatus which comprises an input terminal for receiving either of an analog signal and a digital signal; an up converter for converting up the frequency of a reception signal received at the input terminal into a first intermediate frequency in a high frequency band; a down converter for converting down the frequency of the first intermediate frequency into a second intermediate frequency in a low frequency band; and an output terminal for extracting an output from the down converter. The down converter comprises an automatic frequency controller (AFC) for stabilizing the second intermediate frequency outputted from the down converter. The automatic frequency controller (AFC) comprises a local oscillator for outputting a variable oscillating frequency, and a common input terminal (Vs) for receiving both a signal for controlling the local oscillator when the reception signal is an analog signal and a signal for controlling the local oscillator when the reception signal is a digital signal.

The other aspect of the present invention is directed to an digital and analog reception apparatus which comprises: an input terminal for receiving a reception signal, being either of an analog signal and a digital signal, having an input frequency; a first local oscillator for supplying a first local oscillation signal having a first local frequency; a first mixer for obtaining a first intermediate frequency as a first beat signal having the frequency difference between the input frequency of the reception signal received at the input terminal and the first local frequency of the first local oscillation signal supplied from the first local oscillator, by mixing these signals; an automatic frequency controller (AFC) having a low-pass filter unit (LPF), a second local oscillator connected to the output side of the low-pass filter unit (LPF) for supplying a second local oscillation signal having a second local frequency, and an AFC signal input for receiving an AFC signal for controlling the second local oscillator; a phase-locked loop (PLL) connected to the automatic frequency controller (AFC); control means for controlling an output from the phase-locked loop (PLL) in accordance with an analog/digital distinction of the reception signal, thereby selecting either one of the operations of an input of the AFC signal into the AFC signal input and an activation of the low frequency band pass filter unit (LPF); a second mixer for obtaining a second intermediate frequency as a second beat signal having the frequency difference between the second local frequency of the second local oscillation signal supplied from the second local oscillator and the first intermediate frequency of the first beat signal supplied from the first mixer, by mixing these signals; and an output terminal for extracting an output from the second mixer.

In this reception apparatus, it is preferred that the control means further comprises discrimination means for discriminating the analog/digital distinction of the reception signal, and a memory for storing data on the analog/digital distinction of the reception signal; and the discrimination means discriminates the analog/digital distinction of the reception signal, based on data stored in the memory.

Yet other aspect of the present invention is directed to an digital and analog reception apparatus which comprises: an input terminal for receiving a reception signal, being either of an analog signal and a digital signal, having an input frequency; a first local oscillator for supplying a first local oscillation signal having a first local frequency; a first mixer for obtaining a first intermediate frequency as a first beat signal having the frequency difference between the input frequency of the reception signal received at the input terminal and the first local frequency of the first local oscillation signal supplied from the first local oscillator, by mixing these signals; an automatic frequency controller (AFC) including a low-pass filter unit (LPF) having input and output, a second local oscillator connected to the output of the low-pass filter unit (LPF) for supplying a second local oscillation signal having a second local frequency, and an AFC signal input connected between the low-pass filter unit (LPF) and the second local oscillator for receiving an AFC signal for controlling the second local oscillator; a phase-locked loop (PLL) connected to the automatic frequency controller (AFC), the phase-locked loop having a PLL charge pump output connected to the input of the low-pass filter unit (LPF); a second mixer for obtaining a second intermediate frequency as a second beat signal having the frequency difference between the second local frequency of the second local oscillation signal supplied from the second local oscillator and the first intermediate frequency of the first beat signal supplied from the first mixer, by mixing these signals; an output terminal for extracting an output from the second mixer: and control means for controlling an output from the phase-locked loop (PLL) according to the analog/digital distinction of the reception signal, wherein the control means controls the second local frequency based on the AFC signal received from the AFC signal input by outputting from the PLL charge pump output a signal for deactivating the low-pass filter unit (LPF), upon reception of an analog signal, and controls the second local frequency with the phase-locked loop (PLL) and the low-pass filter unit (LPF) by outputting from the PLL charge pump output a signal for activating the low-pass filter unit (LPF), upon reception of a digital signal.

One of ordinary skills in the art can easily understand additional features and objects of this invention from the description of a preferred embodiment the attached drawings.

DETAILED DESCRIPTION OF THE PREFERRED EMBODIMENT

Hereinbelow, a detailed description of an embodiment of an digital and analog reception apparatus according to the present invention will be described.

Figure 1:
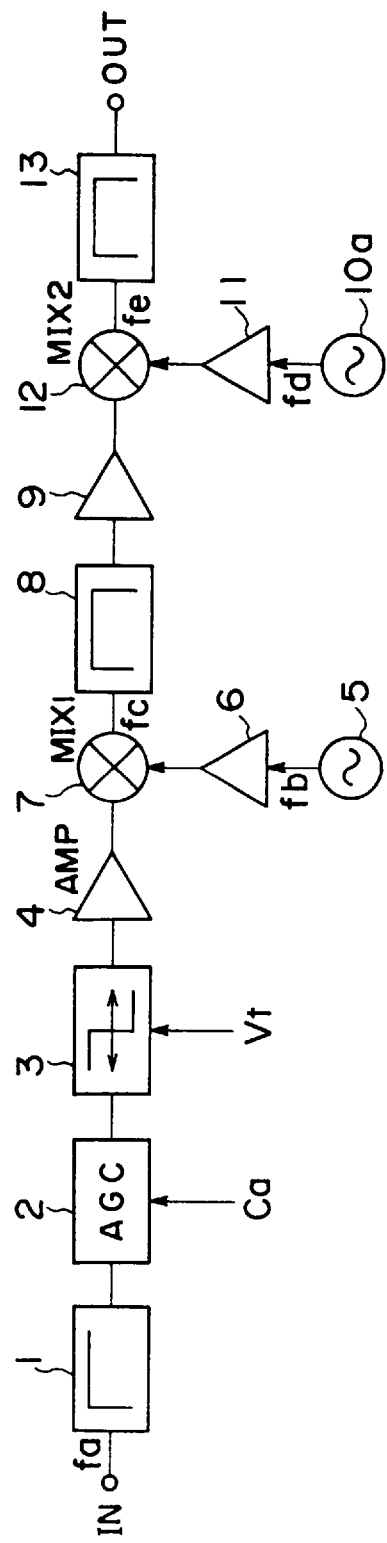
FIG. 1 is a block diagram illustrating the circuit configuration of a CATV converter of a reception apparatus according to the prior art.
Figure 2:
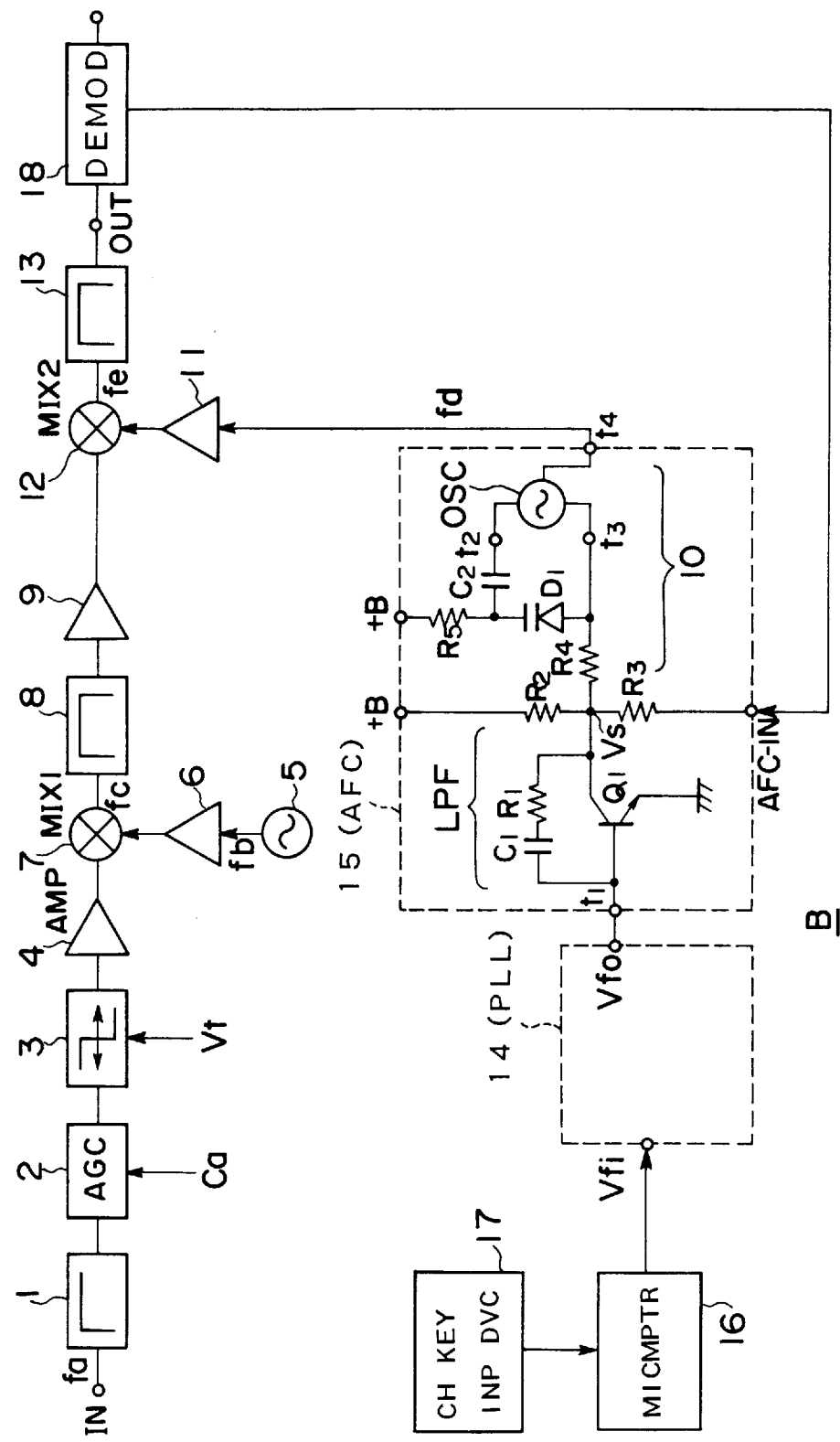
FIG. 2 is a block diagram illustrating the circuit configuration of a CATV Converter of a reception apparatus according to the present invention.

FIG. 2 is a block diagram illustrating the circuit configuration of an digital and analog reception apparatus B of the embodiment, which is applied to a CATV converter used in a CATV broadcasting system. In this regard, it is to be noted that the reference numbers same as those used in FIG. 1 denote the same or similar components.

As see from the figure, a prime feature of the reception apparatus B according to the present invention is an additional provision of a phase-locked loop (PLL) circuit 14, an automatic frequency controller (AFC) 15 for automatically suppressing a frequency deviation within a predetermined range and a demodulator 18.

The phase-locked loop (PLL) circuit 14 is formed in an IC chip, and comprises a phase comparator PCS, charge pump and so forth, although these are not shown in FIG. 2. The phase-locked loop (PLL) circuit 14 receives an input at a frequency signal input terminal Vfi and supplies an output from a PLL charge pump output terminal Vfo.

The automatic frequency controller (AFC) 15 comprises a low-pass filter unit LPF which is generally composed of an NPN transistor Q1, a resistor R1, and a capacitor C1, a second local oscillator 10 which is generally composed of a varactor diode (variable capacitance diode) D1, resistors R4 and R5, a capacitor C2 and an oscillator OSC, and resistors R2 and R3. Also, the automatic frequency controller (AFC) 15 has a tuner terminal AFC-IN, which is an AFC signal input connected to an AFC terminal of a demodulator.

Hereinbelow, the entire structure of the circuit configuration of the reception apparatus B and operation thereof will be described in more detail.

An external wire cable (not shown) supplies to the reception apparatus B a reception signal having an input frequency fa in a predetermined frequency range (e.g. between fifty megahertz [50 MHz] and eight hundred sixty megahertz [860 MHz]), which is received at an input terminal IN. In this embodiment, a reception signal having an input frequency fa can be either of an analog signal and a digital signal.

The reception signal having the input frequency fa received at the input terminal IN is then inputted to a low-pass filter 1 which allows to pass through only a low frequency component of the reception signal. An output from the low-pass filter 1 is then inputted to an automatic gain controller (AGC) 2. The automatic gain controller 2 stabilizes signal level of the inputted signal at a constant regardless of the signal level thereof by automatically controlling a gain (a magnitude of amplification) of the inputted signal in such a manner that when the signal level thereof is high a gain is lowered, while the signal level is low a gain is raised. An output from the automatic gain controller (AGF) 2 is then inputted to a tuning low-pass filter converter 3 which is formed in correspondence with the frequency range (i.e. between fifty megahertz [50 MHz] and five hundred fifty megahertz [550 MHz]) of the reception signal having the input frequency fa. The tuning low-pass filter 3 converts the frequency of the inputted signal from the automatic gain controller (AGC) 2 into either one in a high frequency band or one in a low frequency band. An output from the tuning low-pass filter 3 is then inputted to an amplifier (AMP) 4 in which the output signal from the tuning low-pass filter 3 is amplified. An output from the amplifier 4 is then inputted to a first mixer (MIX1) 7. A first local oscillator 5 also supplies a first local oscillation signal having a first local frequency fb to the first mixer (MIX1) 7 through a first buffer amplifier 6 which amplifies the first local oscillation signal. In the first mixer (MIX1) 7, the first local frequency fb of the first local oscillation signal and the input frequency fa of the reception signal are mixed to obtained a first beat signal having a first intermediate frequency fc corresponding to the frequency difference between these signals. An output from the first mixer (MIX1) 7, that is the first beat signal is then inputted into a first intermediate frequency band pass filter 8 which allows to pass through only a medium frequency component within a predetermined frequency band of the first beat signal having the first intermediate frequency fc received from the first mixer (MIX1) 7. An output from the first intermediate frequency band pass filter 8 is inputted to an intermediate frequency amplifier 9, in which the first beat signal having the first intermediate frequency fc filtered by the first intermediate frequency band pass filter 8 is amplified to be within a predetermined frequency band. An output from the intermediate frequency amplifier 9 is fed to a second mixer (MIX1) 12. Further, the above-described AFC circuit 15 including the second local oscillator 10 also supplies a second local oscillation signal having a second local frequency fd to the second mixer (MIX2) 12 through a second buffer amplifier 11 which amplifies the second local oscillation signal. In the second mixer (MIX2) 12, the second local frequency fd of the second local oscillation signal and the first intermediate frequency fc of the first beat signal are mixed to obtain a second beat signal having a second intermediate frequency fe corresponding to the frequency difference between these signals. An output from the second mixer (MIX2) 12, that is the second beat signal is then inputted to a second intermediate frequency band pass filter 13 which allows to pass through only a medium frequency component within a predetermined frequency band of the second beat signal. An output from the second intermediate frequency band pass filter 13 is then outputted from an output terminal OUT, which forms an output of the reception apparatus B.

In the above-described structure, it is to be noted that the first local oscillator 5, the buffer amplifier 6 and the first mixer (MIX1) 7 constitute an up converter. In more details, the frequency band of the first local oscillation signal having the first local frequency fb lies between one thousand ten megahertz [1010 MHz] and one thousand five hundred ten megahertz [1510 MHz], and the first mixer (MIX1) 7 converts up the frequency band of the reception signal having the input frequency fa into one in a high frequency band, thereby obtaining the first intermediate frequency fc, e.g. of nine hundred sixty megahertz [960 MHz].

Further, in the above-described configuration, the automatic frequency controller (AFC) 15, the second buffer amplifier 11 and the second mixer (MIX2) 12 constitute a down converter. This down converter converts down the frequency band of the first beat signal having the first intermediate frequency fc into one in a low frequency band. To be more specific, the second mixer (MIX2) 12 converts down the frequency band of the first beat signal having the first intermediate frequency fc into one in a low frequency band, thereby obtaining the second intermediate frequency fe, e.g. of forty-four megahertz [44 MHz], of the second beat signal. In this case, the phase-locked loop (PLL) 14 and the automatic frequency controller (AFC) 15 control the second local frequency fd for obtaining the second intermediate frequency fe. Especially, upon receiving an analog signal, they control the second local frequency fd by changing the capacitance of the varactor diode D1, thereby preventing a deviation in the second intermediate frequency fe.

In the reception apparatus of this embodiment, there is further provided a demodulator 18 which is connected to the succeeding stage of the second intermediate frequency band pass filter 13 to receive an input from the output terminal OUT. Although this is not specifically shown in the drawing, the demodulator 18 is generally composed of an intermediate frequency amplifier, a wave-detection demodulator for extracting a voice signal from the second intermediate frequency fe, a voice low-pass filter, a line securitizer (comprising an encoder and a decoder), a voice amplifier, a decompressor for decompressing a waveform having an amplitude compressed for a transmission, and an output amplifier. A voice signal is extracted from a carrier wave centered at the input frequency fa and received via wire cable through these circuit elements mentioned above.

In this regard, it should be noted that in FIG. 2 Ca represents a control signal inputted to the automatic gain controller (AGC) 2, and Vt represents a supply voltage applied to the tuning low-pass Filter 3. The demodulator 18 supplies an output as the output of reception apparatus B, and it further supplies a control signal (AFC signal) to the AFC circuit 15 as described blow.

Described below are the configuration and operation of the phase-locked loop (PLL) 14 and the automatic frequency controller (AFC) 15 for automatically controlling the output from the second local oscillator 10.

The phase-locked loop (PLL) 14 has its PLL charge pump output terminal Vfo. The output terminal Vfo is connected via input terminal t of the automatic frequency controller (AFC) 15 to the base of the NPN transistor Q1. This transistor Q1 has its emitter grounded and its collector connected to a connection point Vs (a common input terminal).

A serial circuit comprising capacitor C1 and resistor R1 is connected in parallel between the base and the collector of the NPN transistor Q1. The connection point Vs is connected via resistor R2 to a power source +B, and it is also connected via resistor R3 to the tuner terminal AFC-IN of the automatic frequency controller (AFC) 15. The automatic frequency controller (AFC) 15 receives at the tuner terminal AFC-IN a control signal (AFC signal) supplied from the demodulator 18.

In addition, the connection point Vs is connected via resistor R4 to the anode side of the varactor diode D1, whose cathode side is connected via resistor R5 to a power source +B. An oscillator OSC and capacitor C2 are connected in parallel to the varactor diode D1 between its anode side and its cathode side.

Thus constructed second local oscillator 10 supplies its output as the second local frequency fd to the second buffer amplifier 11 from a terminal t4.

In this regard, it should be noted that the varactor diode D1 varies its capacitance in accordance with the input voltage of a control signal (e.g. an AFC signal and an output from the low frequency band pass filter unit LPF) applied to the connection point Vs, thereby adjusting an oscillating frequency of the second local oscillator 10, i.e. the second local frequency fd.

Generally, a CATV converter for receiving both a digital signal and an analog signal must have respective demodulators for a digital signal and an analog signal. However, in this embodiment of the present invention, the tuner terminal AFC-IN for receiving an AFC signal and the terminal of the oscillator OSC of the second local oscillator 10 are commonly designated as the connection point Vs, which is also connected to the output side of the low frequency band pass filter unit LPF, such that the automatic frequency controller (AFC) 15 having the demodulator 18 (which is a conventionally used analog demodulator) can detect an analog signal, upon its reception.

The phase-locked loop (PLL) 14 is connected to a microcomputer 16. The microcomputer 16 is a controller for controlling an output from the phase-locked loop (PLL) 14, in accordance with an input from a channel key input device 17 which is connected to the microcomputer 16.

The microcomputer 16 contains a memory, which prestores data (channel plan data) on a channel plan of CATV channels. The channel plan data specify the correspondences between the channel numbers of the reception signals at a receiving station and the analog/digital distinctions of the channel numbers. For example, the channel plan data may be designated in such a manner that signals received at channel numbers one [1] through ten [10] are analog modulation signals and that signals received at channel numbers eleven [11] through twenty [20] are digital modulation signals.

Upon selection of a channel number, the channel key input device 17 inputs a corresponding signal to the microcomputer 16. Then, the microcomputer 16 discriminates the analog/digital distinction of the reception signal having the input frequency fa based on the channel plan data using its internally contained discriminator (realized e.g. by a software program for discrimination). The microcomputer 16 controls an output from the phase-locked loop (PLL) 14, based on the discrimination result.

In more details, as a result of this discrimination, when the reception signal having an input frequency fa is discriminated to be an analog signal, the microcomputer 16 outputs frequency data for minimizing the frequency of the input into the frequency signal input terminal Vfi of the phase-locked loop (PLL) 14. This produces zero output from the PLL charge pump output terminal Vfo, that is none voltage is applied to the base of the NPN transistor Q1 for driving it, thereby preventing the NPN transistor Q1 from being driven (turned off). This opens the tuner terminal AFC-IN, thereby activating the automatic frequency controller (AFC) 15 to a state in which it is pulled up to the voltage of the power source +B. In other words, when the automatic frequency controller (AFC) 15 is activated, the automatic frequency controller (AFC) 15 controls the second local frequency fd of a signal outputted from the second local oscillator 10, based on the AFC signal inputted from the tuner terminal AFC-IN.

That is, the microcomputer 16 inputs the minimum frequency data into the phase-locked loop PLL) 14, such that the phase-locked loop PLL) 14 supplies from the PLL charge pump output terminal Vfo its output in accordance with the negative polarity operation (an output from the PLL charge pump output terminal Vfo having a polarity opposite to that of an input of the AFC signal) of the automatic frequency controller (AFC) 15. This deactivates the NPN transistor Q1, thereby effectively interrupting a connection between the second local oscillator 10 and the low-pass filter unit LPF. As a result, the automatic frequency controller (AFC) 15 causes the AFC signal, which is a control signal for adjusting the second local frequency fd outputted from the second local oscillator 10, to be supplied via the tuner terminal AFC-IN and the connection point Vs to the varactor diode D1. In this way, it is possible to adjust a frequency deviation (a deviation of the second intermediate frequency fe) caused by an analog transmission system having a poor frequency accuracy, and it is also possible to adjust a frequency deviation caused by an ambient environment. Then, this adjustment enables a stable signal having an appropriate frequency to be outputted from the output terminal OUT.

On the other hand, when the discrimination result indicates that the reception signal fa is a digital signal, the microcomputer 16 outputs predetermined frequency data (data specifying a unique second local frequency fd) to the phase-locked loop (PLL) 14, thereby activating the phase-locked loop (PLL) 14. At this time, an output from the PLL charge pump output terminal Vfo causes the base of the NPN transistor Q1 of the low-pass filter unit LPF to be driven, thereby activating the low-pass filter unit LPF. Then, pursuant to the same principle as described above, a signal inputted via the low-pass filter unit LPF into the connection point Vs controls the second local oscillator 10, thereby setting the second local frequency fd.

At this time, the demodulator 18 does not output an AFC signal. Thus, only the phase-locked loop ILL) 14 and the low-pass filter unit LPF control the second local oscillator 10. This configuration enables the reception apparatus B to output a signal having a stable frequency from output terminal OUT, upon receiving a digital signal.

Although a preferred embodiment of this invention has been described with reference to the attached drawings, an embodiment of this invention is by no means limited to the form described above.

For instance, the first local oscillator 5 may also comprise circuit elements similar to the phase-locked loop (PLL) 14 and the automatic frequency controller (AFC) 15 for adjusting the first local frequency fb. Also, this invention is applicable not only to a reception apparatus of a CATV broadcasting system, but also to a reception apparatus of a satellite broadcasting system, for example, as well as other generic reception apparatus for commonly receiving an analog signal and a digital signal.

As is apparent from the above description, this invention enables a hybrid reception apparatus to receive both an analog signal and a digital signal. Because it uses most of its components for commonly receiving both signals, it has a simple circuit configuration with a reduced number of components. Accordingly, this reception apparatus has an advantage of a small size and a low manufacturing cost.

Further, this reception apparatus has a further advantage of being able to obtain an output signal having a stable frequency, upon receiving both an analog signal and a digital signal. Especially, it can appropriately adjust a frequency deviation due to an ambient environment and a frequency deviation in an analog transmission system having a poor frequency accuracy.

Furthermore, when this reception apparatus has a controller, more specifically, when this reception apparatus has a discriminator for discriminating the analog/digital distinction of a reception signal, it can automatically perform a control and an adjustment in a frequency deviation in accordance with a reception signal.

Although this invention has been described in its preferred forms with a certain degree of particularity, it is understood that the present disclosure of the preferred forms has been changed in details of construction and that the combination and arrangement of parts may be restored to without departing from the spirit and the scope of this invention as hereinafter claimed.

What is claimed is:

1. A digital and analog reception apparatus, comprising:

an input terminal for receiving a reception signal, being either of an analog signal and a digital signal, having an input frequency;

a first local oscillator for supplying a first local oscillation signal having a first local frequency;

a first mixer for obtaining a first intermediate frequency as a first beat signal having the frequency difference between the input frequency of the reception signal received at said input terminal and the first local frequency of the first local oscillation signal supplied from said first local oscillator, by mixing these signals;

an automatic frequency controller (AFC) having a low-pass filter unit (LPF), a second local oscillator connected to the output side of said low-pass filter unit (LPF) for supplying a second local oscillation signal having a second local frequency, and an AFC signal input for receiving an AFC signal for controlling said second local oscillator;

a phase-locked loop (PLL) connected to said automatic frequency controller;

control means for controlling an output from said phase-locked loop (PLL) in accordance with an analog/digital distinction of the reception signal, thereby selecting either one of the operations of an input of the AFC signal into said AFC signal input and an activation of said low-pass filter unit (LPF);

a second mixer for obtaining a second intermediate frequency as a second beat signal having the frequency difference between the second local frequency of the second local oscillation signal supplied from said second local oscillator and the first intermediate frequency of the first beat signal supplied from said first mixer, by mixing these signals; and an output terminal for extracting an output from said second mixer.

2. The digital and analog reception apparatus as set forth in claim 1, wherein said control means further comprises discrimination means for discriminating the analog/digital distinction of the reception signal.

3. The digital and analog reception apparatus as set forth in claim 2, wherein said control means further comprises a memory for storing data on the analog/digital distinction of the reception signal, in which said discrimination means discriminates the analog/digital distinction of the reception signal, based on data stored in said memory.

4. A digital and analog reception apparatus, comprising:

an input terminal for receiving a reception signal, being either of an analog signal and a digital signal, having an input frequency;

a first local oscillator for supplying a first local oscillation signal having a first local frequency;

a first mixer for obtaining a first intermediate frequency as a first beat signal having the frequency difference between the input frequency of the reception signal received at said input terminal and the first local frequency of the first local oscillation signal supplied from said first local oscillator, by mixing these signals;

an automatic frequency controller (AFC) including a low-pass filter unit (LPF) having input and output, a second local oscillator connected to the output of said low-pass filter unit (LPF) for supplying a second local oscillation signal having a second local frequency, and an AFC signal input connected between said low-pass filter unit (LPF) and said second local oscillator for receiving an AFC signal for controlling said second local oscillator;

a phase-locked loop (PLL) connected to said automatic frequency controller, said phase-locked loop having a PLL charge pump output connected to the input of said low-pass filter unit (LPF);

a second mixer for obtaining a second intermediate frequency as a second beat signal having the frequency difference between the second local frequency of the second local oscillation signal supplied from said second local oscillator and the first intermediate frequency of the first beat signal supplied from said first mixer, by mixing these signals;

an output terminal for extracting an output from said second mixer; and control means for controlling an output from said phase-locked loop (PLL) according to the analog/digital distinction of the reception signal, wherein said control means controls the second local frequency wherein the second local frequency is based on the AFC signal received from said AFC signal input by outputting from said PLL charge pump output a signal for deactivating said low-pass filter unit (LPF), upon reception of an analog signal, and controls the second local frequency with said phase-locked loop PLL) and said low-pass filter unit (LPF) by outputting from said PLL charge pump output a signal for activating said low-pass filter unit (LPF), upon reception of a digital signal.

5. The digital and analog reception apparatus as set forth in claim 4, wherein said low-pass filter unit (LPF) further comprises a transistor having a base thereof, in which a signal outputted from said PLL charge pump output activates said low-pass filter unit (LPF) by driving the base of said transistor, upon reception of a digital signal.

6. The digital and analog reception apparatus as set forth in claim 4, wherein said control means further comprises discrimination means for discriminating the analog/digital distinction of the reception signal.

7. The digital and analog reception apparatus as set forth in claim 6, wherein said control means further comprises a memory for storing data on the analog/digital distinction of the reception signal, in which said discriminating means discriminates the analog/digital distinction of the reception signal, based on data stored in said memory.

8. The digital and analog reception apparatus as set forth in claim 6, wherein said control means further comprises a memory for storing channel plan data on the correspondence between the channel number of a reception station and the analog/digital distinction of the reception signal, in which said discrimination means discriminates the analog/digital distinction of the reception signal having a particular channel number, based on said channel plan data stored in said memory.

* * * * *